(12) United States Patent
Kagawa

(10) Patent No.: US 12,140,861 B2
(45) Date of Patent: Nov. 12, 2024

(54) PATTERN FORMING METHOD, TEMPLATE MANUFACTURING METHOD, AND PHOTOMASK MANUFACTURING METHOD

(71) Applicant: Kioxia Corporation, Tokyo (JP)

(72) Inventor: Yoshinori Kagawa, Tokyo (JP)

(73) Assignee: Kioxia Corporation, Tokyo (JP)

( * ) Notice: Subject to any disclaimer, the term of this patent is extended or adjusted under 35 U.S.C. 154(b) by 208 days.

(21) Appl. No.: 17/199,339

(22) Filed: Mar. 11, 2021

(65) Prior Publication Data

US 2022/0091499 A1      Mar. 24, 2022

(30) Foreign Application Priority Data

Sep. 18, 2020   (JP) .................. 2020-157622

(51) Int. Cl.
   *G03F 1/76*      (2012.01)
(52) U.S. Cl.
   CPC ....................... *G03F 1/76* (2013.01)
(58) Field of Classification Search
   CPC ................ G03F 1/76; G03F 1/62; G03F 1/40
   See application file for complete search history.

(56) References Cited

U.S. PATENT DOCUMENTS

| | | | |
|---|---|---|---|
| 2016/0254153 A1* | 9/2016 | Park | H01L 21/76843 438/695 |
| 2017/0153539 A1* | 6/2017 | Tu | H01L 21/0337 |
| 2018/0143536 A1* | 5/2018 | Yaegashi | H01L 23/544 |
| 2018/0307078 A1* | 10/2018 | Liu | G02F 1/13394 |

FOREIGN PATENT DOCUMENTS

| | | |
|---|---|---|
| JP | 2010-3991 A | 1/2010 |
| JP | 2011-71383 A | 4/2011 |
| JP | 5644290 B2 | 12/2014 |

* cited by examiner

*Primary Examiner* — Sean M DeGuire
*Assistant Examiner* — Jayson D Cosgrove
(74) *Attorney, Agent, or Firm* — Finnegan, Henderson, Farabow, Garrett & Dunner, LLP

(57) ABSTRACT

According to one embodiment, a pattern forming method includes forming a first film on an object to be processed, forming a first opening pattern and a second opening pattern in the first film, forming a second film, forming a third opening pattern and a fourth opening pattern in the second film, and processing the object to be processed. The second opening pattern is provided in a position where the second opening pattern does not overlap the first opening pattern in plan view. The third opening pattern is provided in a position where the third opening pattern partly overlaps the first opening pattern and does not overlap the second opening pattern in plan view. The fourth opening pattern is provided in a position where the fourth opening pattern does not overlap the first opening pattern, the second opening pattern, and the third opening pattern.

20 Claims, 13 Drawing Sheets

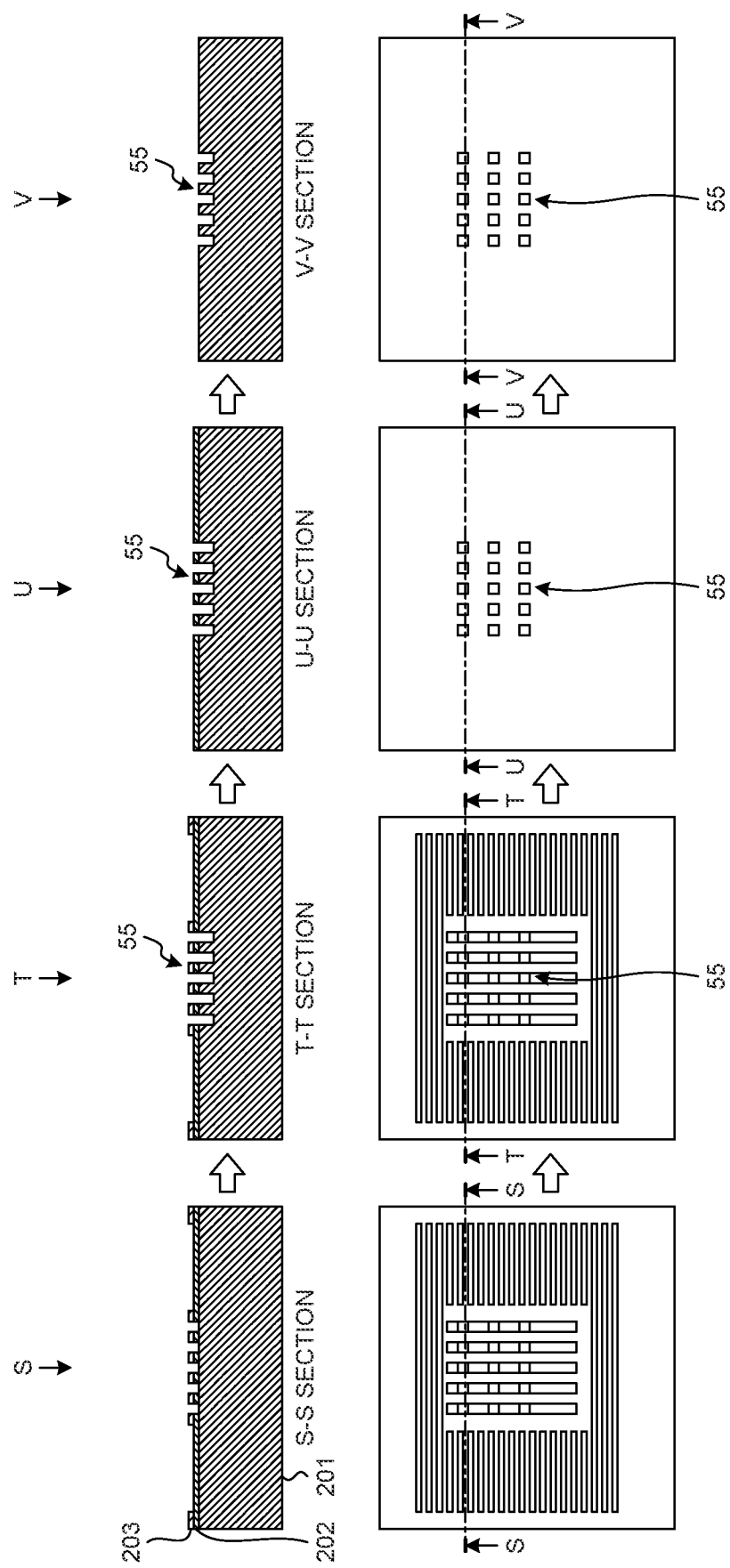

PATTERN FORMING METHOD, TEMPLATE MANUFACTURING METHOD, AND PHOTOMASK MANUFACTURING METHOD

CROSS-REFERENCE TO RELATED APPLICATIONS

This application is based upon and claims the benefit of priority from Japanese Patent Application No. 2020-157622, filed on Sep. 18, 2020; the entire contents of which are incorporated herein by reference.

FIELD

Embodiments described herein relate generally to a pattern forming method, a template manufacturing method, and a photomask manufacturing method.

BACKGROUND

As a technique for forming a predetermined pattern in an object to be processed such as a substrate, double patterning is used. Double patterning is a technique in which a series of processes including lithography (photolithography) and etching is repeated twice or more using two or more resist patterns, to form a predetermined pattern in an object to be processed.

It is an object of the embodiments of the present invention to provide a pattern forming method, a template manufacturing method, and a photomask manufacturing method that can improve accuracy of processing that uses double patterning.

BRIEF DESCRIPTION OF THE DRAWINGS

FIG. 15 is a view illustrating examples of states in the third etching and a stripping process in the original-plate manufacturing method according to the second embodiment.

DETAILED DESCRIPTION

In general, according to one embodiment, a pattern forming method includes forming a first film on an object to be processed, forming a first opening pattern and a second opening pattern in the first film, forming a second film, forming a third opening pattern and a fourth opening pattern in the second film, and processing the object to be processed. The second opening pattern is provided in a position where the second opening pattern does not overlap the first opening pattern in plan view. The second film is formed on the object to be processed on which the first film is formed, after the first opening pattern and the second opening pattern are formed. The third opening pattern is provided in a position where the third opening pattern partly overlaps the first opening pattern and does not overlap the second opening pattern in plan view. The fourth opening pattern is provided in a position where the fourth opening pattern does not overlap the first opening pattern, the second opening pattern, and the third opening pattern. A portion of the object to be processed is processed, the portion corresponding to a position where the first opening pattern and the third opening pattern overlap each other in plan view.

Hereinafter, exemplary embodiments of the pattern forming method will be explained in detail with reference to the accompanying drawings. The present invention is not limited to the following embodiments. Further, composing elements in the following embodiments include ones that can be easily thought of by a person skilled in the art or ones that are substantially the same therewith.

First Embodiment (Configuration Example of Substrate Processing Apparatus)

Figure 1:
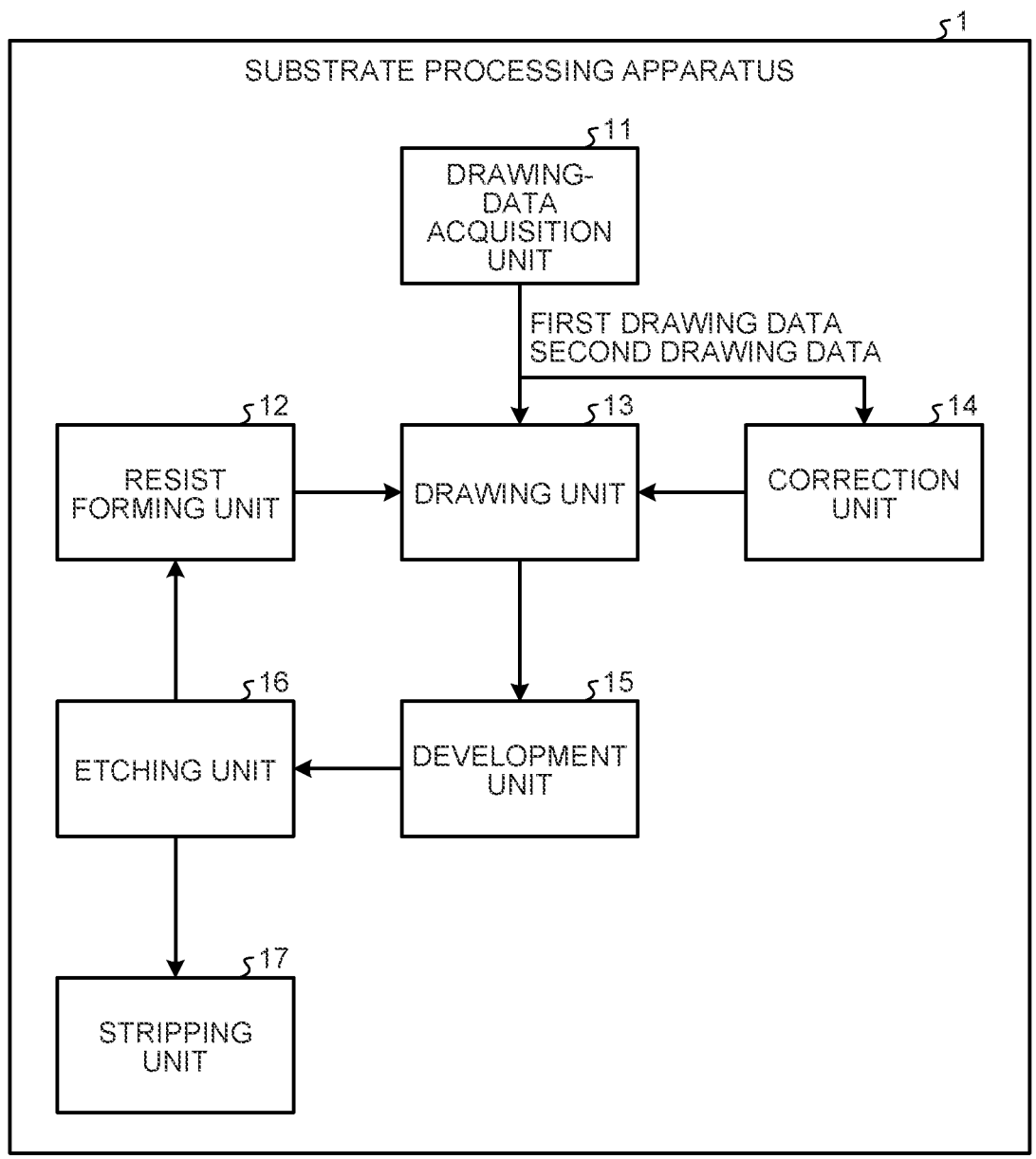
FIG. 1 is a view illustrating an example of a configuration of a substrate processing apparatus according to a first embodiment.

FIG. 1 is a view illustrating an example of a configuration of a substrate processing apparatus 1 according to a first embodiment. The substrate processing apparatus 1 is an apparatus that processes a substrate (an object to be processed) using double patterning. Double patterning is a technique in which a series of processes including lithography and etching is repeated twice or more using two or more resist patterns, to form a predetermined pattern in a substrate. With the use of double patterning, it is possible to form a desired pattern in a substrate by adjusting a portion of overlap (AND portion) between a first resist pattern used in the first lithography and a second resist pattern used in the second lithography. The substrate processing apparatus 1 can manufacture an original plate for a template, a photomask, or the like used in a semiconductor process or the like, for example.

The substrate processing apparatus 1 includes a drawing-data acquisition unit 11, a resist forming unit 12, a drawing unit 13, a correction unit 14, a development unit 15, an etching unit 16, and a stripping unit 17.

The drawing-data acquisition unit 11 acquires first drawing data for drawing a first resist pattern on a resist and second drawing data for drawing a second resist pattern on a resist. The drawing-data acquisition unit 11 can be formed by cooperation of a computer, a program, and the like, for example.

The resist forming unit 12 forms a layer of resist on a substrate that is an object to be processed. A sacrificial layer (hard mask layer) may be interposed between the substrate and the resist. The resist forming unit 12 can be formed of a spin coater or the like, for example.

The drawing unit 13 draws the first resist pattern on a resist in accordance with the first drawing data in the first lithography and draws the second resist pattern on a resist in accordance with the second drawing data in the second lithography. The drawing unit 13 can be formed of an electron-beam drawing apparatus or the like that irradiates a resist with electron beams, for example.

The correction unit 14 performs a correction process of correcting operations of the drawing unit 13 based on the coverage of a resist. Coverage is a value indicating a proportion of an area occupied by a resist in a predetermined region on a layer underlying (sacrificial layer, for example) the resist, or a proportion of a drawing portion in drawing data. The correction unit 14 corrects an electron-beam irradiation amount, an electron-beam irradiation position, and the like for an electron-beam drawing apparatus, for example, based on the coverage. The correction unit 14 according to the present embodiment calculates coverage for the first resist pattern based on the first drawing data and corrects operations of the drawing unit 13 for drawing the first resist pattern, based on the calculated coverage. Further, the correction unit 14 calculates coverage for the second resist pattern based on the second drawing data and corrects operations of the drawing unit 13 for forming the second resist pattern, based on the calculated coverage. The correction unit 14 can be formed by cooperation of a computer, a program, and the like, for example.

The development unit 15 develops a resist pattern drawn on a resist.

The etching unit 16 performs etching on a layered object on which a resist pattern is developed. Layers to be etched vary depending on a layered structure of the layered object or progress of double patterning. For example, in a case where one sacrificial layer is interposed between a substrate and a resist, the sacrificial layer is etched in the first etching and the sacrificial layer and the substrate are etched in the second etching.

The stripping unit 17 strips residual layers such as a resist and a sacrificial layer from a substrate.

Additionally, though there has been described above as an example, a configuration in which the substrate processing apparatus 1 includes all of the above-described composing elements 11 to 17, each or some of the composing elements 11 to 17 may be formed as an independent device.

(Example of Original-Plate Manufacturing Method)

Below, with reference to FIGS. 2 to 5, there will be described an example of an original-plate manufacturing method of manufacturing a template as an example of original plate by forming a predetermined pattern in a substrate 101 using double patterning. Here, there will be described a case where a sacrificial layer 102 (first sacrificial layer) containing chromium, chromium oxide, or chromium nitride is interposed between the substrate 101 containing quartz and a resist 103.

Figure 2:
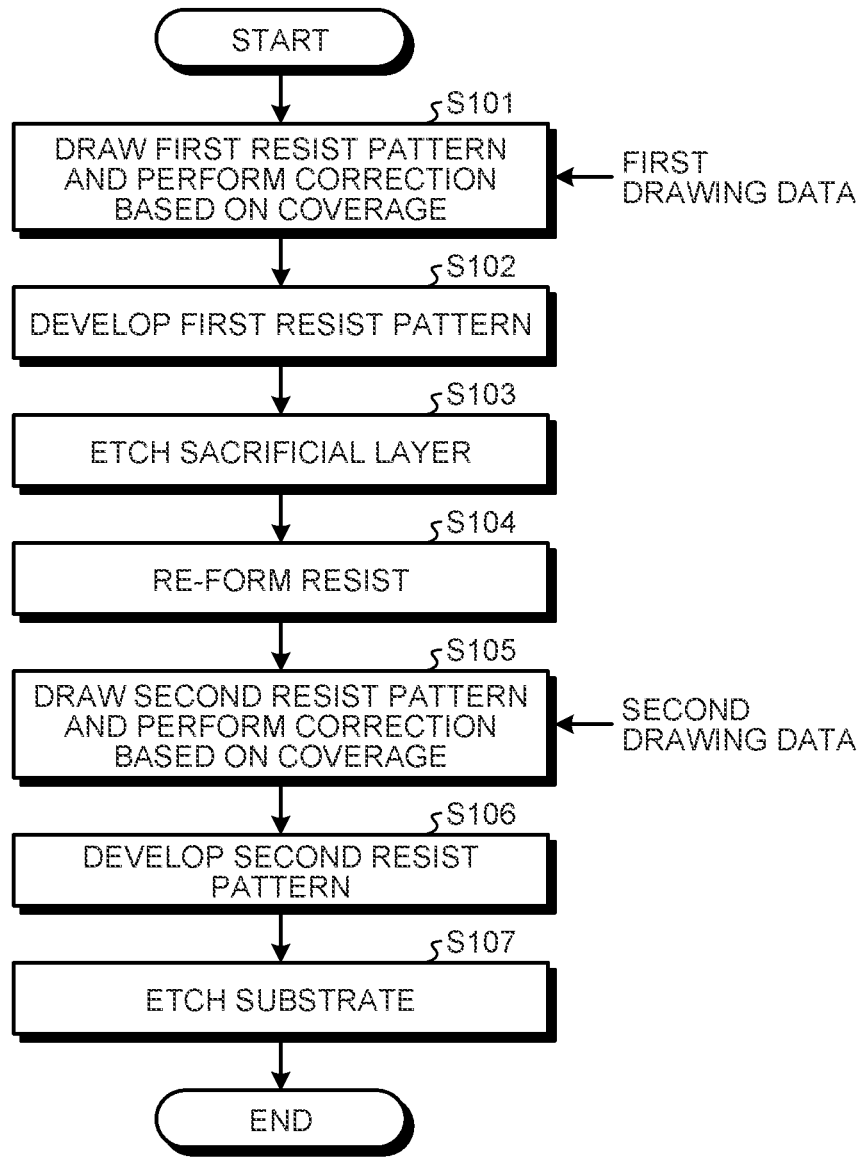
FIG. 2 is a flowchart illustrating an example of an original-plate manufacturing method according to the first embodiment.
Figure 3:
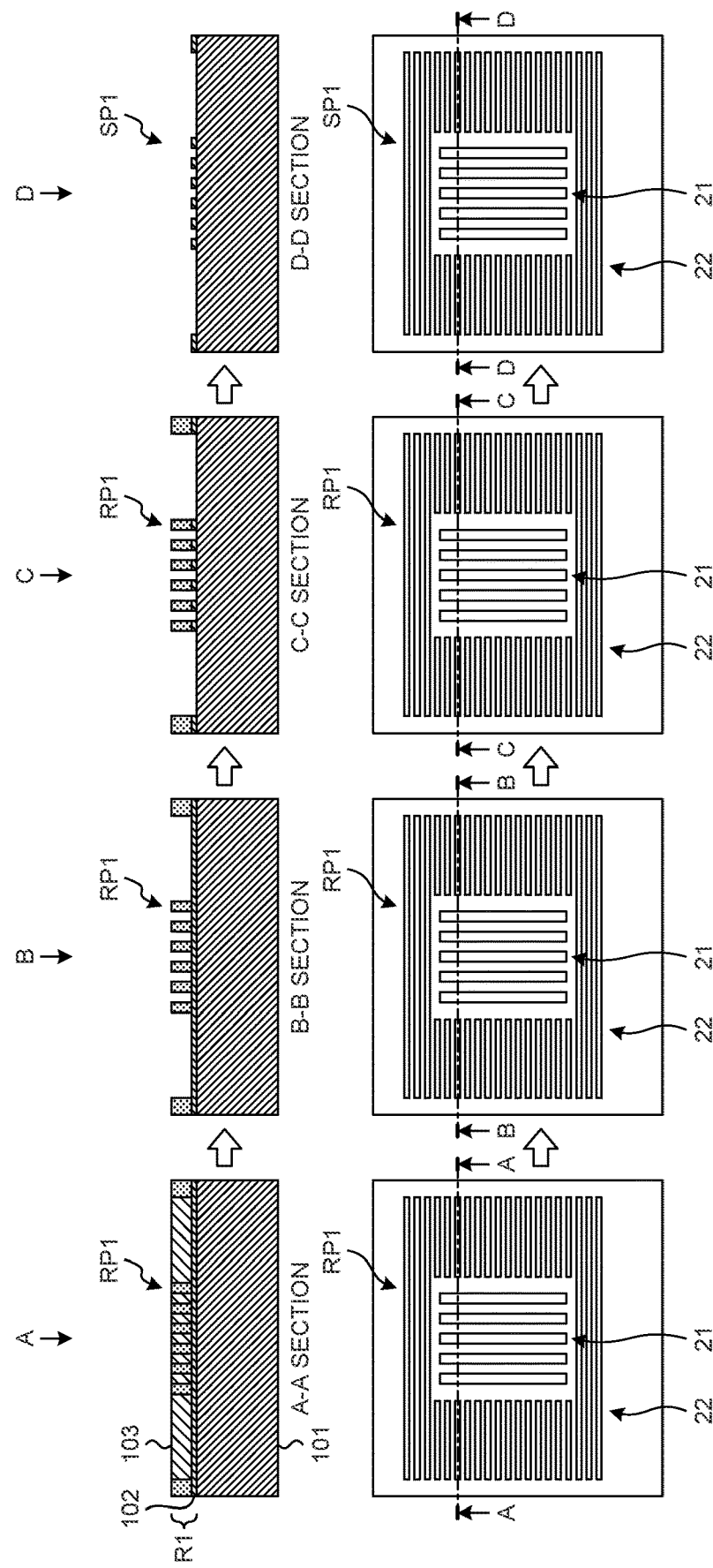
FIG. 3 is a view illustrating examples of states in the first lithography and the first etching in the original-plate manufacturing method according to the first embodiment.
Figure 4:
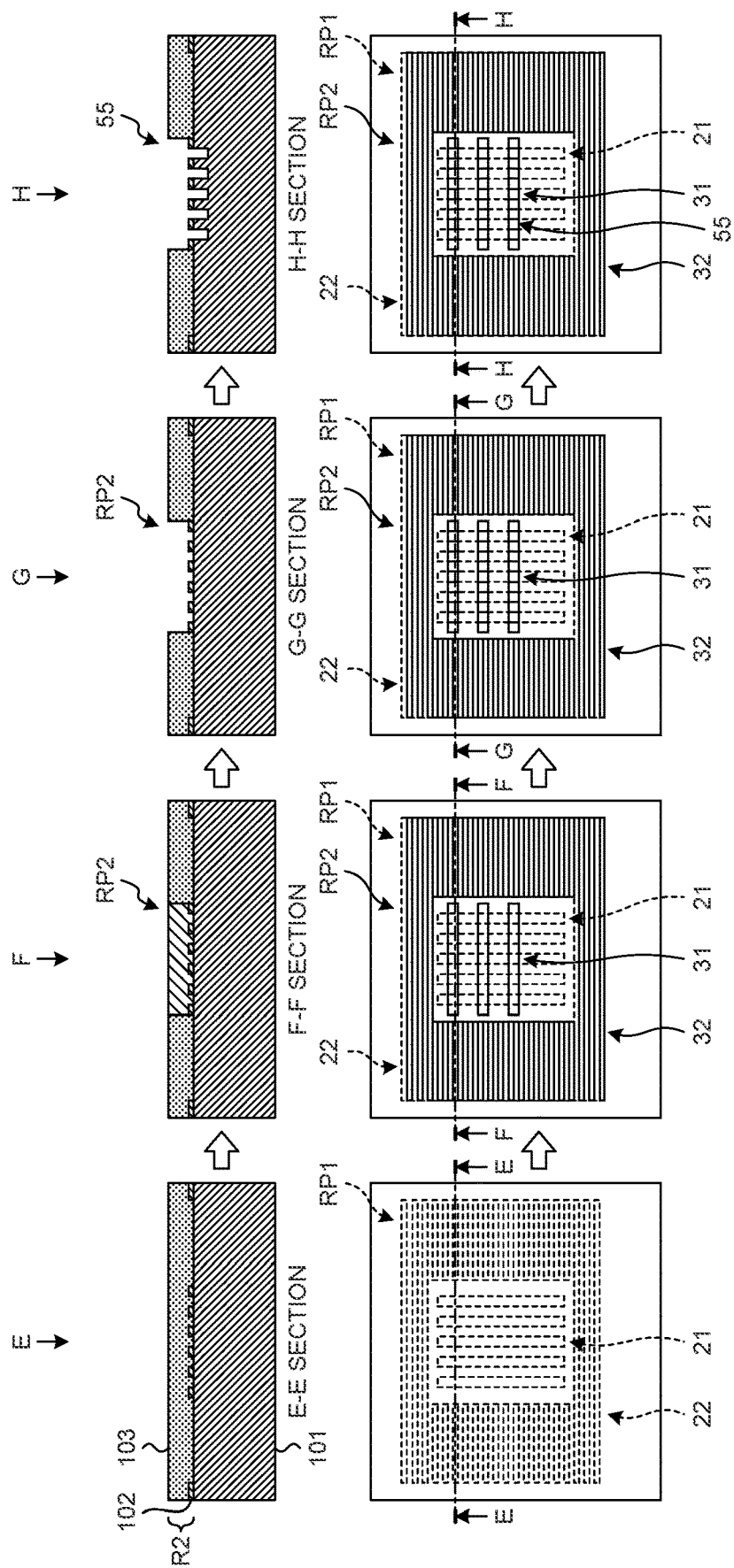
FIG. 4 is a view illustrating examples of states in the second lithography and the second etching in the original-plate manufacturing method according to the first embodiment.
Figure 5:
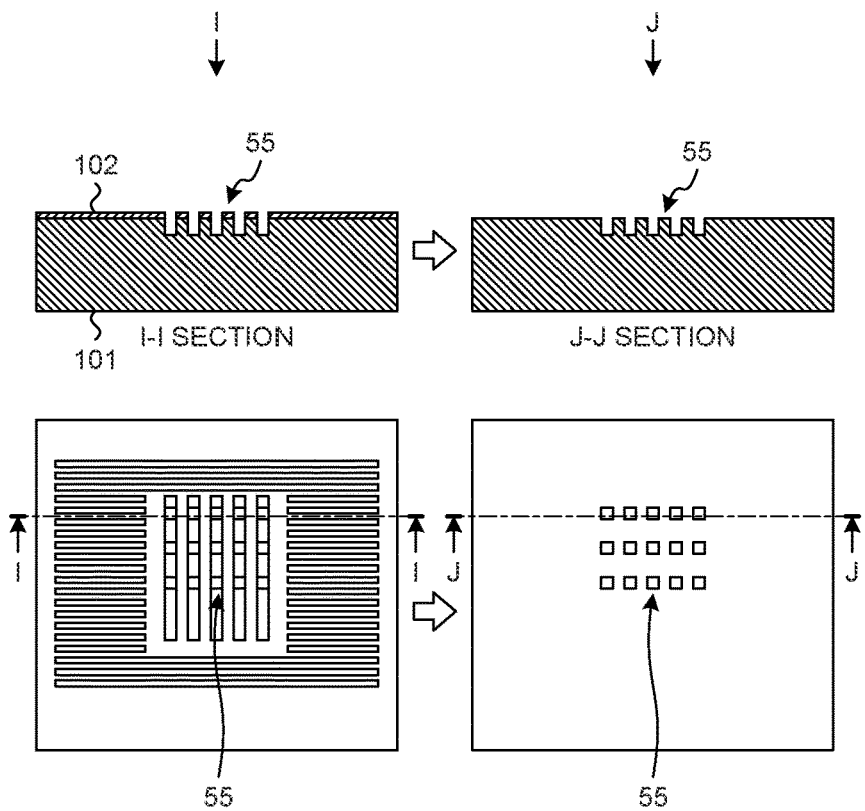
FIG. 5 is a view illustrating examples of states occurring when a stripping process is performed in the original-plate manufacturing method according to the first embodiment.

FIG. 2 is a flowchart illustrating the example of original-plate manufacturing method according to the first embodiment. FIG. 3 is a view illustrating examples of states in the first lithography and the first etching in the original-plate manufacturing method according to the first embodiment. FIG. 4 is a view illustrating examples of states in the second lithography and the second etching in the original-plate manufacturing method according to the first embodiment. FIG. 5 is a view illustrating examples of states occurring when a stripping process is performed in the original-plate manufacturing method according to the first embodiment.

In the flowchart of FIG. 2, the drawing unit 13 draws a first resist pattern RP1 on a first layer R1 (a layer including the sacrificial layer 102 and the resist 103 in the present embodiment) formed on the substrate 101, in accordance with the first drawing data acquired by the drawing-data acquisition unit 11 (S101, a state A in FIG. 3). The first resist pattern RP1 includes a first main pattern 21 (first opening pattern) and a first sub pattern 22 (second opening pattern). The first main pattern 21 and the first sub pattern 22 will be described later. At that time (at the time of drawing the first resist pattern RP1), the correction unit 14 performs a correction process of correcting operations of the drawing unit 13 based on the coverage of the resist 103 calculated from the first drawing data (S101).

Subsequently, the development unit 15 develops the first resist pattern RP1 drawn on the resist 103 of the first layer R1 (S102, a state B in FIG. 3), and the etching unit 16 etches the sacrificial layer 102 of the first layer R1 (S103, a state C in FIG. 3). Then, the stripping unit 17 strips the resist 103 (a state D in FIG. 3). As a result of this, a sacrificial-layer pattern SP1 having the same shape as the first resist pattern RP1 is formed in the sacrificial layer 102 of the first layer R1.

Subsequently, the resist forming unit 12 re-forms the resist 103 on the sacrificial layer 102 having been etched (S104, a state E in FIG. 4). As a result of this, a second layer R2 including the sacrificial layer 102 having the sacrificial-layer pattern SP1 formed therein and the re-formed resist 103 is formed on the substrate 101. The drawing unit 13 draws a second resist pattern RP2 on the resist 103 of the second layer R2 in accordance with the second drawing data acquired by the drawing-data acquisition unit 11 (S105, a state F in FIG. 4). The second resist pattern RP2 includes a second main pattern 31 (third opening pattern) and a second sub pattern 32 (fourth opening pattern). The second main pattern 31 and the second sub pattern 32 will be described later. At that time (at the time of drawing the second resist pattern RP2), the correction unit 14 performs a correction process of correcting operations of the drawing unit 13 based on the coverage of the resist 103 calculated from the second drawing data (S105).

Subsequently, the development unit 15 develops the second resist pattern RP2 drawn on the resist 103 of the second layer R2 (S106, a state G in FIG. 4). Thereafter, the etching unit 16 etches the substrate 101 being exposed (S107, a state H in FIG. 4). At that time, the etching of the substrate 101 is performed in a position corresponding to an AND portion where the first resist pattern RP1 and the second resist pattern RP2 overlap each other in plan view. As a result of this, a predetermined pattern 55 is formed on the substrate 101.

Subsequently, the stripping unit 17 strips the resist 103 (a state I in FIG. 5), and further strips the sacrificial layer 102 (a state J in FIG. 5).

By the above-described method, the substrate 101 (template) having the predetermined pattern 55 formed therein can be manufactured.

Other Example of Object to be Processed

Additionally, though the substrate 101 used as a template has been described above as an example of an object to be processed, an object to be processed is not limited to that. For example, an object to be processed may be a photomask or the like.

Figure 6:
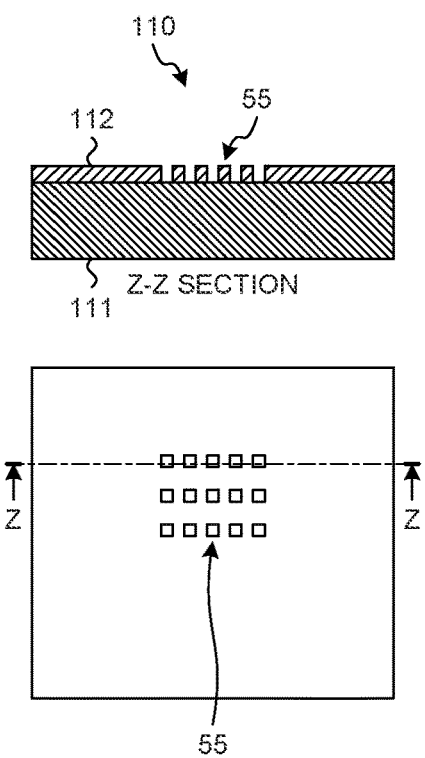
FIG. 6 is a view illustrating an example of a configuration of a photomask.

FIG. 6 is a view illustrating an example of a configuration of a photomask 110. As illustrated in FIG. 6, the photomask 110 as an example of an object to be processed includes a transparent substrate 111 containing quartz or the like and a light shield film 112 (a film containing chromium, or the like, for example) formed on the substrate 111, and has the above-described pattern 55 formed on the light shield film 112. Thus, an object to be processed according to the present embodiment includes various kinds of objects that can be processed using double patterning.

(Configuration Example of Resist Pattern)

Below, with reference to FIGS. 7 to 11, there will be described configuration examples of the first resist pattern RP1 and the second resist pattern RP2, together with the effects produced thereby.

Figure 7:
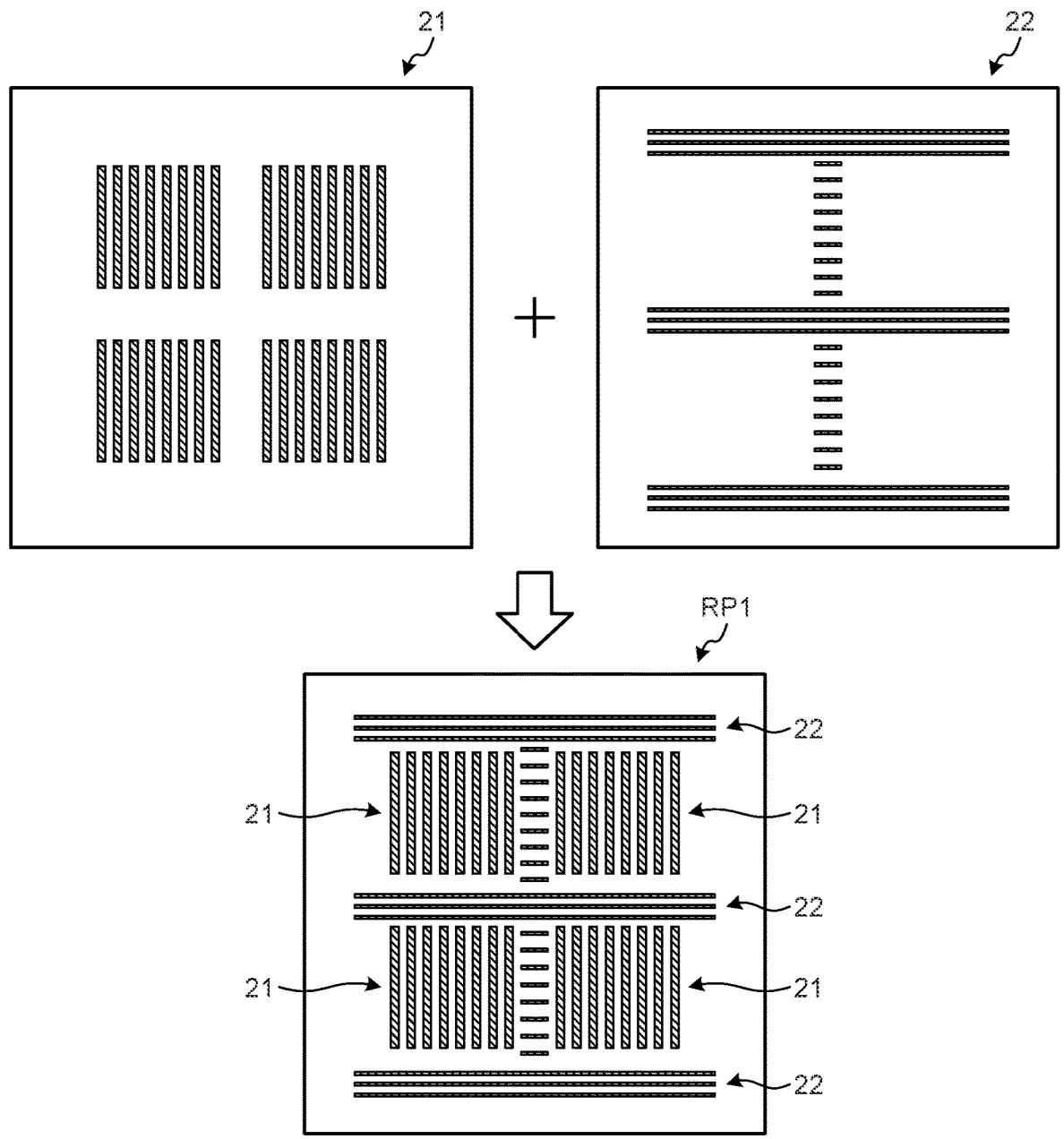
FIG. 7 is a view illustrating an example of a first resist pattern according to the first embodiment.

FIG. 7 is a view illustrating an example of the first resist pattern RP1 according to the first embodiment. The first resist pattern RP1 includes the first main pattern 21 and the first sub pattern 22. Additionally, though the first resist pattern RP1 illustrated in FIG. 7 and the first resist pattern RP1 illustrated in FIGS. 3 to 5 have different pattern shapes, the functions of those patterns are substantially the same with each other. Here, description will be made with reference to the first resist pattern RP1 illustrated in FIG. 7.

The first main pattern 21 is a pattern for forming the desired pattern 55 on the substrate 101. The first main pattern 21 partly overlaps the second main pattern 31 described later, thereby forming an AND portion.

The first sub pattern 22 is formed in a position where the first sub pattern 22 does not overlap the first main pattern 21. Further, the first sub pattern 22 is formed in a position where the first sub pattern 22 does not overlap not only the first main pattern 21, but also the second main pattern 31 and the second sub pattern 32 that will be described later. Thus, the first sub pattern 22 does not contribute to formation of the desired pattern 55. The first sub pattern 22 is intended to uniformize the coverage of the resist 103 in drawing the first resist pattern RP1.

Forming the first sub pattern 22 around the first main pattern 21 as illustrated in FIG. 7 reduces variation in coverage at a boundary between an area where the first main pattern 21 is formed and the periphery of the area. This improves accuracy of a correction process performed in drawing the first resist pattern RP1, as compared to that in a case where the first sub pattern 22 is not provided.

Figure 8:
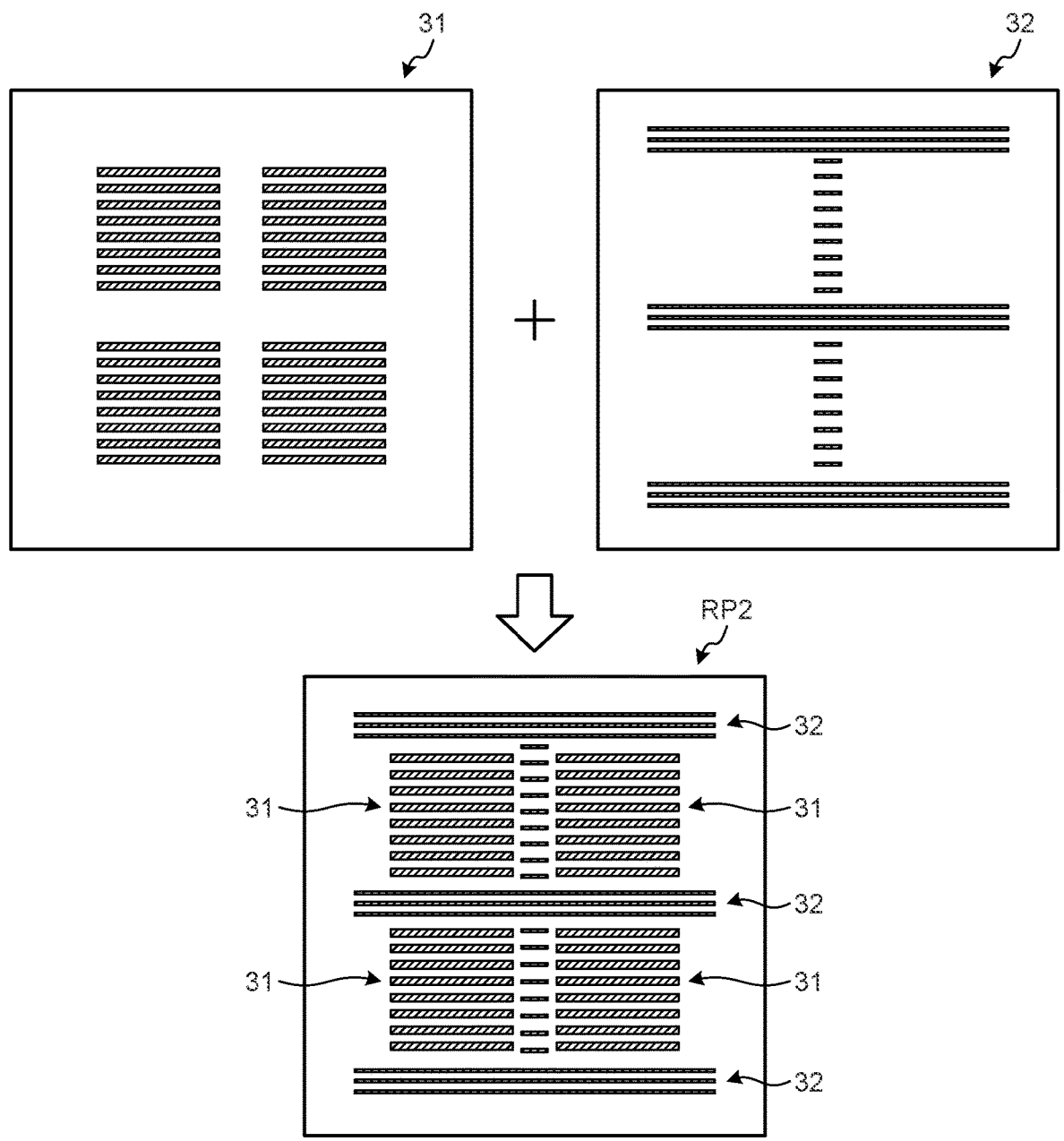
FIG. 8 is a view illustrating an example of a second resist pattern according to the first embodiment.

FIG. 8 is a view illustrating an example of the second resist pattern RP2 according to the first embodiment. The second resist pattern RP2 includes the second main pattern 31 and the second sub pattern 32. Though the second resist pattern RP2 illustrated in FIG. 8 and the second resist pattern RP2 illustrated in FIGS. 3 to 5 have different pattern shapes, the functions of those patterns are substantially the same with each other. Here, description will be made with reference to the second resist pattern RP2 illustrated in FIG. 8.

The second main pattern 31 is a pattern for forming the desired pattern 55 in the substrate 101. The second main pattern 31 partly overlaps the above-described first main pattern 21, thereby forming the AND portion.

The second sub pattern 32 is formed in a position where the second sub pattern 32 does not overlap the second main pattern 31. Further, the second sub pattern 32 is formed in a position where the second sub pattern 32 does not overlap not only the second main pattern 31, but also the first main pattern 21 and the first sub pattern 22 that have been described above. Thus, the second sub pattern 32 does not contribute to formation of the desired pattern 55. The second sub pattern 32 is intended to uniformize the coverage of the resist 103 in drawing the second resist pattern RP2.

Forming the second sub pattern 32 around the second main pattern 31 as illustrated in FIG. 8 reduces variation in coverage at a boundary between an area where the second main pattern 31 is formed and the periphery of the area. This improves accuracy of a correction process performed in drawing the second resist pattern RP2, as compared to that in a case where the second sub pattern 32 is not provided.

Figure 9:
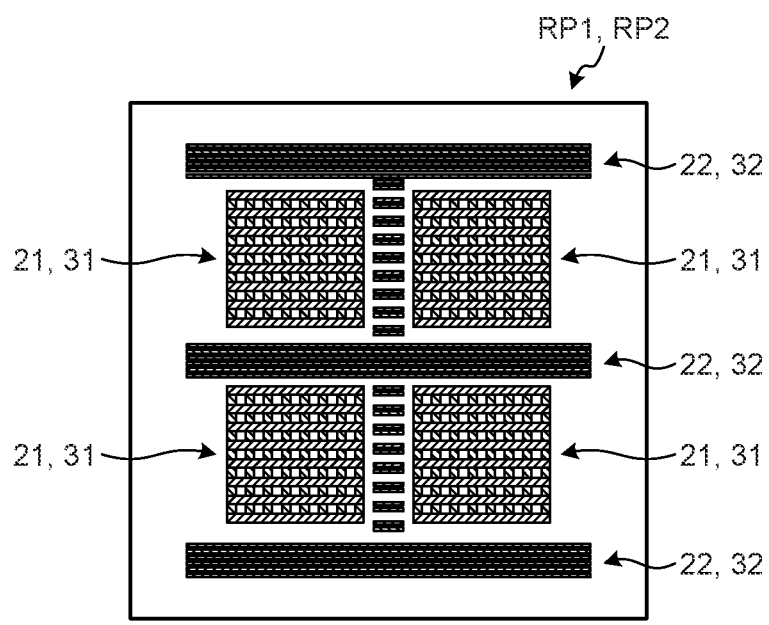
FIG. 9 is a view illustrating an example of a state in which the first resist pattern in FIG. 7 and the second resist pattern in FIG. 8 overlap each other.

FIG. 9 is a view illustrating an example of a state in which the first resist pattern RP1 illustrated in FIG. 7 and the second resist pattern RP2 illustrated in FIG. 8 overlap each other. As illustrated in FIG. 9, the first main pattern 21 and the second main pattern 31 are formed so that respective parts thereof overlap each other. A portion where the first main pattern 21 and the second main pattern 31 overlap each other is an AND portion for forming the desired pattern 55 on the substrate 101. The AND portion in the present embodiment forms a pattern having a plurality of holes in grid arrangement. However, a pattern that can be formed by the AND portion is not limited to that.

Further, as illustrated in FIG. 9, the first sub pattern 22 does not overlap any of the first main pattern 21, the second main pattern 31, and the second sub pattern 32. Moreover, the second sub pattern 32 does not overlap any of the first main pattern 21, the second main pattern 31, and first sub pattern 22. Because of this configuration, the first sub pattern 22 and the second sub pattern 32 act to reduce variation in coverage without forming an AND portion.

Figure 10:
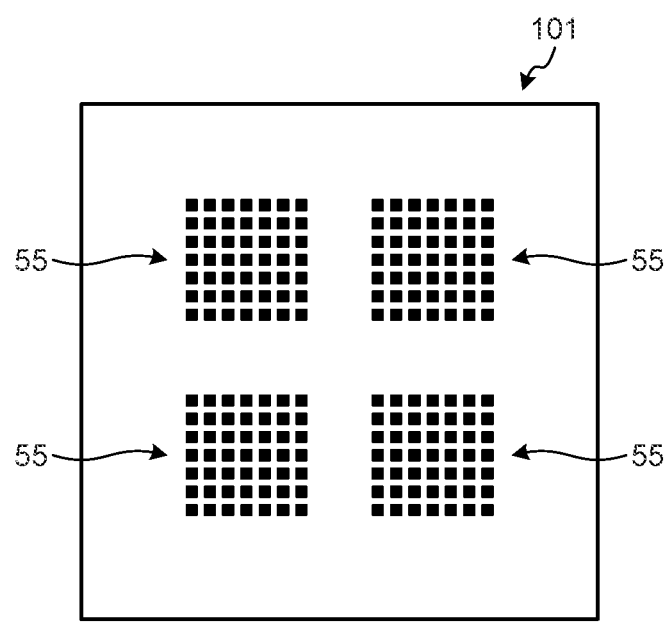
FIG. 10 is a view illustrating an example of a pattern to be formed on a substrate in a case where the first resist pattern in FIG. 7 and the second resist pattern in FIG. 8 are used.

FIG. 10 is a view illustrating an example of the pattern 55 that is formed on the substrate 101 in a case where the first resist pattern RP1 illustrated in FIG. 7 and the second resist pattern RP2 illustrated in FIG. 8 are used. Eventually, the pattern 55 is formed in a position corresponding to the AND portion where the first main pattern 21 and the second main pattern 31 overlap each other, in the substrate 101.

Figure 11:
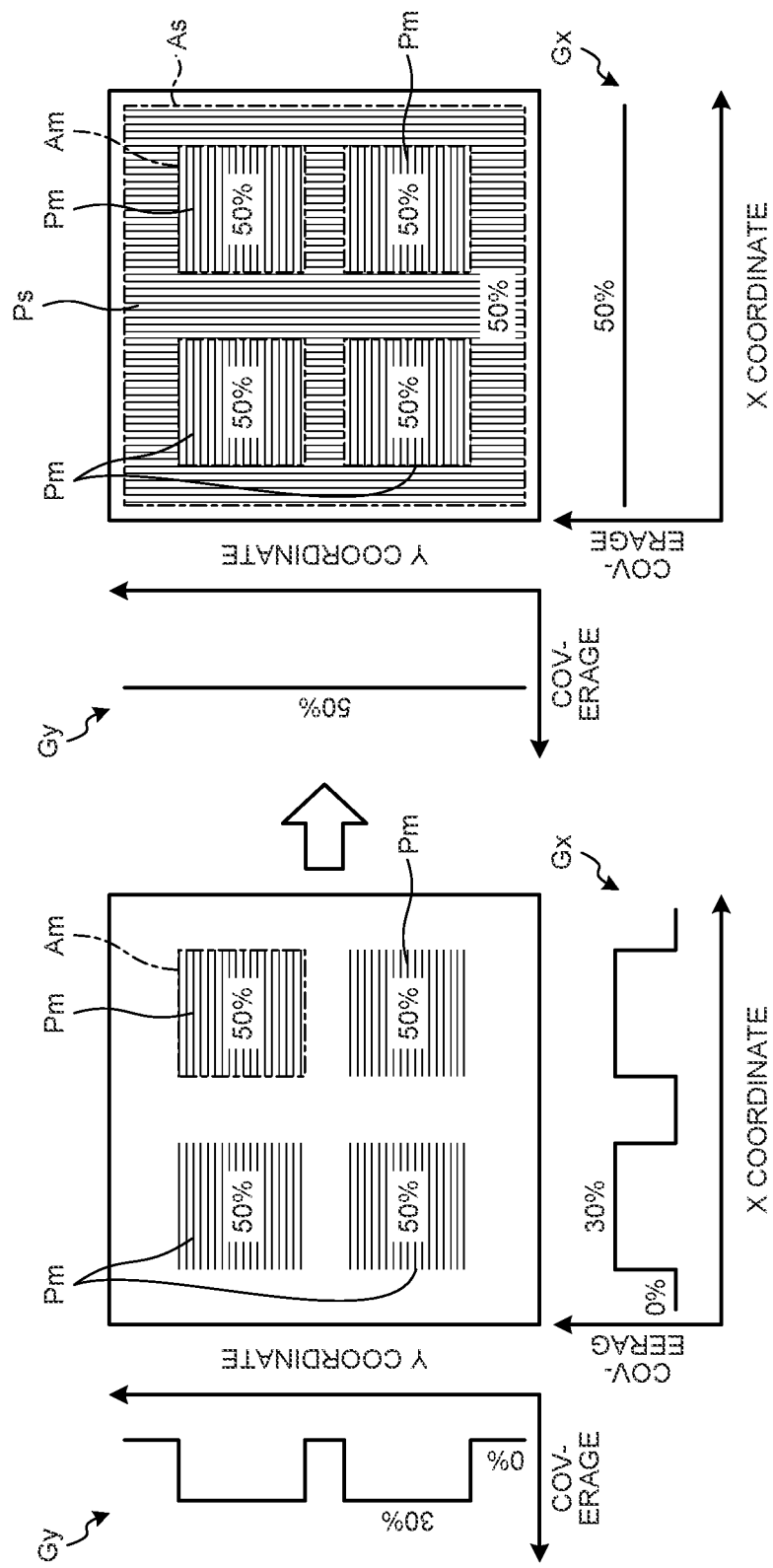
FIG. 11 is a view for explaining effects produced by a sub pattern according to the first embodiment.

FIG. 11 is a view for explaining the effects produced by a sub pattern Ps (the first sub pattern 22 or the second sub pattern 32) according to the first embodiment. In FIG. 11, a pattern corresponding to the above-described first main pattern 21 or second main pattern 31 is illustrated as a main pattern Pm and a pattern corresponding to the above-described first sub pattern 22 or second sub pattern 32 is illustrated as a sub pattern Ps. In FIG. 11, the illustration on the left side represents an example of a resist pattern including only the main pattern Pm and the illustration on the right side represents an example of a resist pattern including the main pattern Pm and the sub pattern Ps.

Further, in FIG. 11, the term "50%" on the main pattern Pm means that the coverage in each of four areas Am where the main pattern Pm is formed is 50%. Meanwhile, the term "50%" on the sub pattern Ps means that the coverage in an area As where the sub pattern Ps is formed is 50%.

Moreover, in FIG. 11, there are illustratively provided graphs Gx indicating relationships between an X coordinate and coverage, and graphs Gy indicating relationships between a Y coordinate and coverage. The graphs Gx each indicate average coverage in a case where the coverage at a certain X-coordinate position is measured vertically (in parallel with a Y axis). The graphs Gy each indicate average coverage in a case where the coverage at a certain Y-coordinate position is measured horizontally (in parallel with an X axis).

In the resist pattern including only the main pattern Pm (on the left side), the coverage varies greatly at a boundary between the area Am where the main pattern Pm is formed and the periphery of the area. In the present embodiment, the coverage varies abruptly in a range from 0% to 30%. On the other hand, in the resist pattern including the main pattern Pm and the sub pattern Ps (on the right side), the coverage hardly varies at a boundary between the area Am where the main pattern Pm is formed and the area As where the sub pattern Ps is formed. In the present embodiment, the coverage is uniformized to approximately 50%.

As described above, forming the sub pattern Ps (the first sub pattern 22 or the second sub pattern 32) can uniformize the coverage of the resist 103, which enables improvement in accuracy of a correction process performed in drawing a resist pattern.

(Example of Drawing-Data Generating Method)

Below, with reference to FIG. 12, there will be described an example of a method of generating drawing data for forming a resist pattern including the above-described main pattern and sub pattern. Here, there will be described an example of a method of generating the first drawing data for drawing the first resist pattern RP1 on the resist 103 and the second drawing data for drawing the second resist pattern RP2 on the resist 103.

Figure 12:
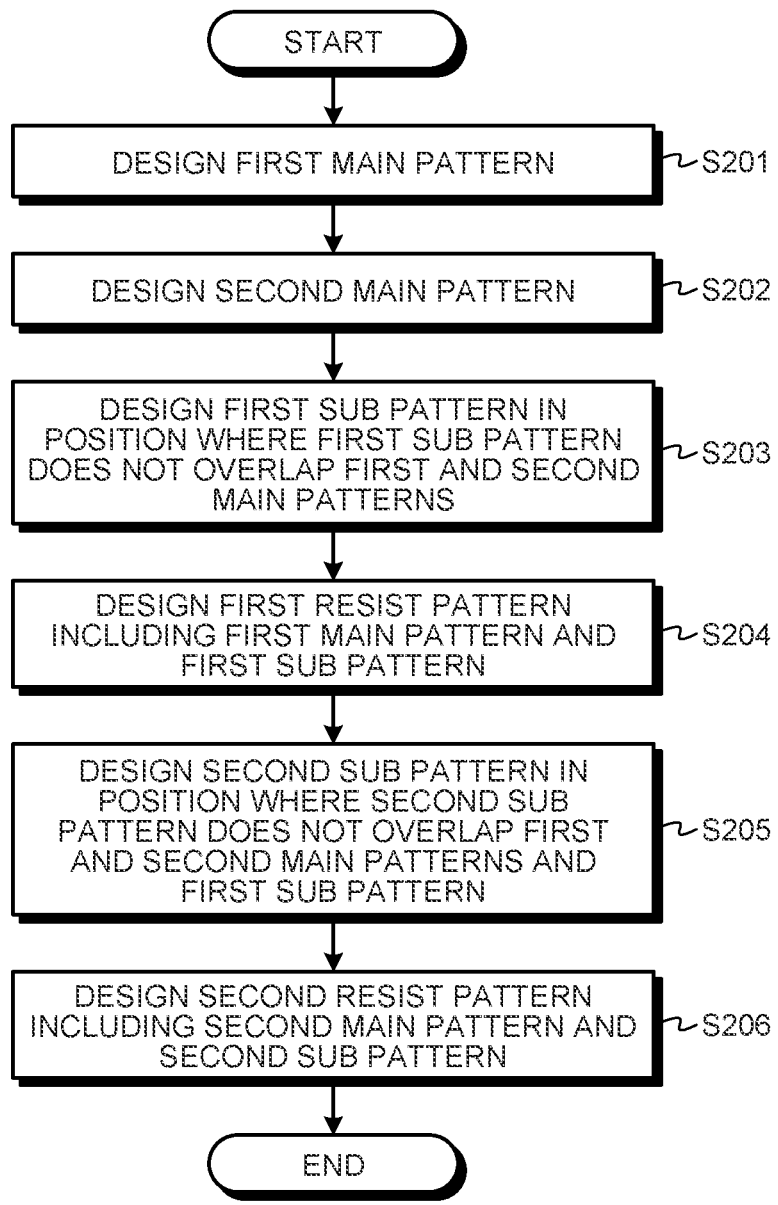
FIG. 12 is a flowchart illustrating an example of a drawing-data generating method according to the first embodiment.

FIG. 12 is a flowchart illustrating an example of a drawing-data generating method according to the first embodiment. First, the first main pattern 21 is designed (S201), and subsequently the second main pattern 31 is designed (S202). The first main pattern 21 and the second main pattern 31 are so designed that an AND portion where those patterns overlap each other coincides with the desired pattern 55 that is eventually formed in the substrate 101.

Subsequently, the first sub pattern 22 is designed in a position where the first sub pattern 22 does not overlap either of the first main pattern 21 and the second main pattern 31 (S203). At that time, the first sub pattern 22 is so designed as to reduce variation in the coverage of the resist 103 at a boundary between an area where the first main pattern 21 is formed and the periphery of the area. Subsequently, the first resist pattern RP1 including the first main pattern 21 and the first sub pattern 22 is designed (S204), so that the first drawing data for drawing the first resist pattern RP1 is generated.

Subsequently, the second sub pattern 32 is designed in a position where the second sub pattern 32 does not overlap any of the first main pattern 21, the second main pattern 31, and the first sub pattern 22 (S205). At that time, the second sub pattern 32 is so designed as to reduce variation in the coverage of the resist 103 at a boundary between an area where the second main pattern 31 is formed and the periphery of the area. Subsequently, the second resist pattern RP2 including the second main pattern 31 and the second sub pattern 32 is designed (S206), so that the second drawing data for drawing the second resist pattern RP2 is generated.

By following the above-described procedure, it is possible to generate drawing data for drawing a resist pattern that can uniformize the coverage of the resist 103 (that is, can improve accuracy of a correction process) in double patterning.

A program that causes a computer to execute processing for implementing the above-described various functions can be offered while being recorded in a file in an installable format or an executable format on a computer-readable recording medium such as a compact disc (CD)-ROM, a flexible disc (FD), a CD-Recordable (R), or a digital versatile disk (DVD). Alternatively, the program may be offered or distributed via a network such as the Internet.

According to the above-described embodiment, accuracy of substrate processing using double patterning can be improved.

Second Embodiment

Below, with reference to FIGS. 13 to 15, a second embodiment will be described. The present embodiment is different from the first embodiment in that two sacrificial layers 202 and 203 are interposed between a substrate 201 and a resist 204.

Figure 13:
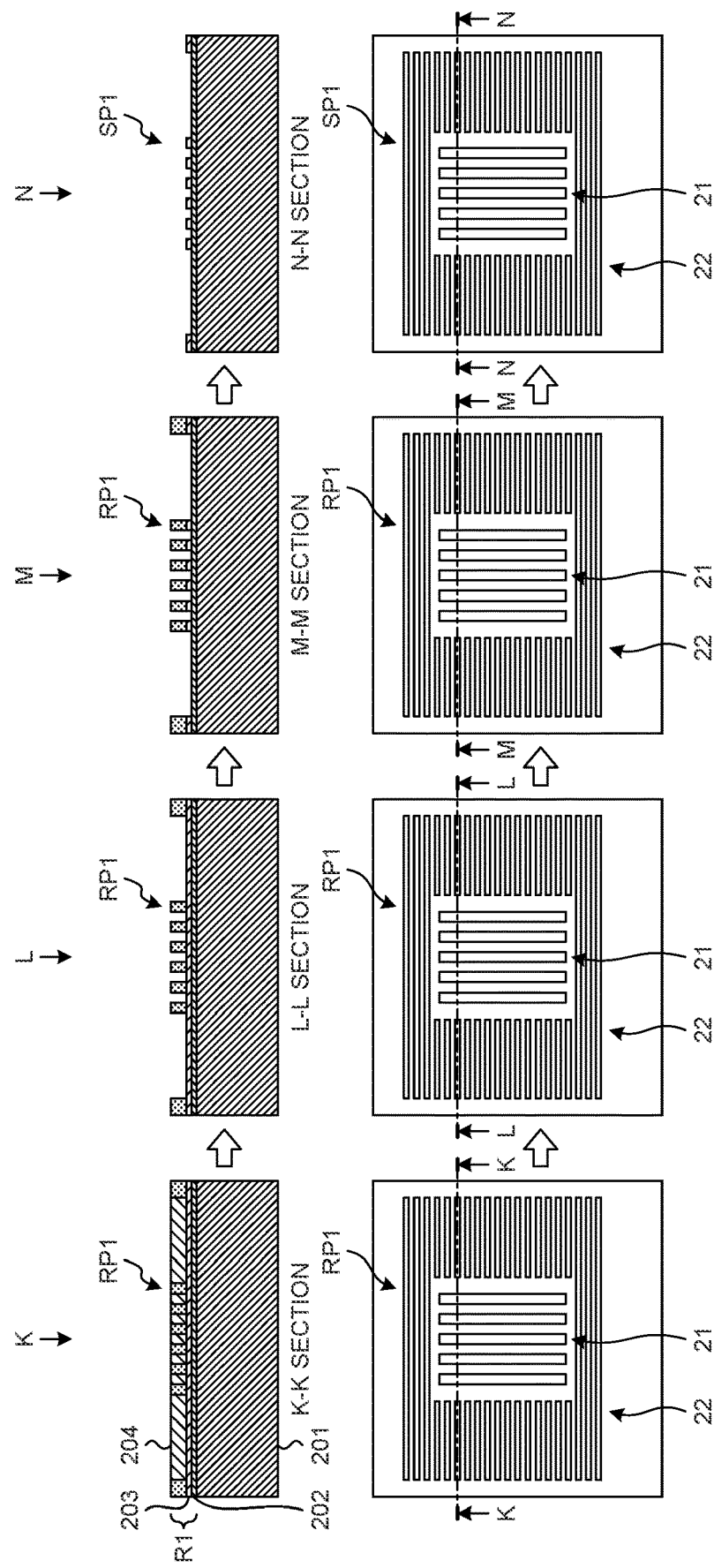
FIG. 13 is a view illustrating examples of states in the first lithography and the first etching in an original-plate manufacturing method according to a second embodiment.
Figure 14:
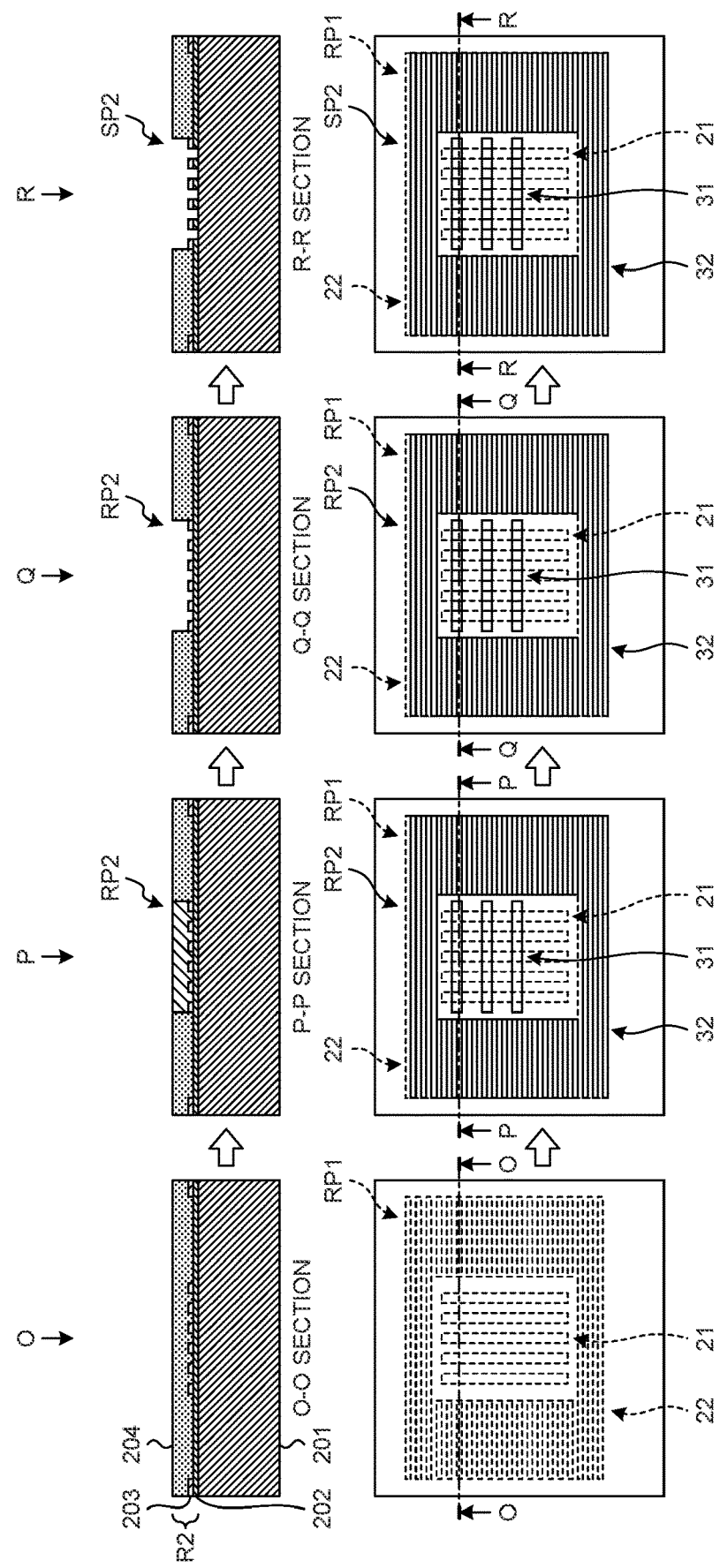
FIG. 14 is a view illustrating examples of states in the second lithography and the second etching in the original-plate manufacturing method according to the second embodiment.

FIG. 13 is a view illustrating examples of states in the first lithography and the first etching in an original-plate manufacturing method according to the second embodiment. FIG. 14 is a view illustrating examples of states in the second lithography and the second etching in the original-plate manufacturing method according to the second embodiment. FIG. 15 is a view illustrating examples of states in the third etching and a stripping process in the original-plate manufacturing method according to the second embodiment.

In the present embodiment, the first sacrificial layer 202 is formed on the substrate 201, the second sacrificial layer 203 is formed on the first sacrificial layer 202, and the resist 204 is formed on the second sacrificial layer 203. The substrate 201 contains quartz. The first sacrificial layer 202 contains chromium, chromium oxide, or chromium nitride. The second sacrificial layer 203 contains silicon or silicon oxide.

In the present embodiment, a first resist pattern RP1 is drawn on a first layer R1 (a layer including the first sacrificial layer 202, the second sacrificial layer 203, and the resist 204) formed on the substrate 201 (a state K in FIG. 13). Then, the drawn first resist pattern RP1 is developed (a state L in FIG. 13), the second sacrificial layer 203 is etched (a state M in FIG. 13), and the resist 204 is stripped (a state N in FIG. 13). As a result of this, a first sacrificial-layer pattern SP1 having the same shape as the first resist pattern RP1 is formed in the second sacrificial layer 203 of the first layer R1.

Subsequently, the resist 204 is re-formed on the second sacrificial layer 203 that has been etched (a state O in FIG. 14). As a result of this, a second layer R2 including the first sacrificial layer 202, the second sacrificial layer 203 having the first sacrificial-layer pattern SP1 formed therein, and the re-formed resist 204 is formed on the substrate 201. Subsequently, a second resist pattern RP2 is drawn on the resist 204 of the second layer R2 (a state P in FIG. 14), and the drawn second resist pattern RP2 is developed (a state Q in FIG. 14). Then, the first sacrificial layer 202 being exposed is etched (a state R in FIG. 14). At that time, the etching of the first sacrificial layer 202 is performed in a position corresponding to an AND portion where the first resist pattern RP1 (the first sacrificial-layer pattern SP1) and the second resist pattern RP2 overlap each other. As a result of this, a second sacrificial-layer pattern SP2 having the same shape as the second resist pattern RP2 is formed in the first sacrificial layer 202 of the second layer R2.

Thereafter, the resist 204 is stripped (a state S in FIG. 15) and the substrate 201 is etched (a state T in FIG. 15). As a result of this, the predetermined pattern 55 is formed on the substrate 201. At that time, because of presence of the two sacrificial layers 202 and 203, the substrate 201 can be subjected to deeper engraving with more excellent rectangularity, as compared to that in a case where a single sacrificial layer is provided. Subsequently, the second sacrificial layer 203 is stripped (a state U in FIG. 15), and further the first sacrificial layer 202 is stripped (a state V in FIG. 15).

As described above, using the two sacrificial layers 202 and 203 enables successful formation of the relatively deep pattern 55. Meanwhile, using the single sacrificial layer 102 as in the first embodiment has an advantage of simplifying processes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
   forming a first film on an object to be processed;
   forming a first opening pattern including at least two openings on a first region and a second opening pattern including at least two openings on a second region surrounding the first region in the first film, the second opening pattern being provided in a position where the second opening pattern does not overlap the first opening pattern in plan view;
   forming a second film on the object to be processed on which the first film is formed, after forming the first opening pattern and the second opening pattern;
   forming a third opening pattern including at least two openings on the first region and a fourth opening pattern including at least two openings on a second region surrounding the first region in the second film, the third opening pattern being provided in a position where the third opening pattern partly overlaps the first opening pattern and does not overlap the second opening pattern in plan view, and the fourth opening pattern being provided in a position where the fourth opening pattern does not overlap the first opening pattern, the second opening pattern, and the third opening pattern in plan view; and
   processing a portion of the object to be processed where the first opening pattern and the third opening pattern overlap each other in plan view,
   wherein the second opening pattern is designed to reduce variation in a coverage between the first opening pattern and the second opening pattern, and
   the fourth opening pattern is designed to reduce variation in a coverage between the third opening pattern and the fourth opening pattern.

2. The pattern forming method according to claim 1, wherein
   the first film includes a first resist layer and a first sacrificial layer formed on the object to be processed, and
   the second film includes a second resist layer formed on the object to be processed.

3. The pattern forming method according to claim 2, wherein
   the first film further includes a second sacrificial layer including a composition different from that of the first sacrificial layer.

4. The pattern forming method according to claim 1, wherein
   the object to be processed contains quartz.

5. The pattern forming method according to claim 2, wherein
   the first sacrificial layer contains chromium, chromium oxide, or chromium nitride.

6. The pattern forming method according to claim 3, wherein
   the second sacrificial layer contains silicon or silicon oxide.

7. A template manufacturing method comprising:
   forming a first film on a substrate;
   forming a first opening pattern including at least two openings on a first region and a second opening pattern including at least two openings on a second region surrounding the first region in the first film, the second opening pattern being provided in a position where the second opening pattern does not overlap the first opening pattern in plan view;
   forming a second film on the substrate on which the first film is formed, after forming the first opening pattern and the second opening pattern;
   forming a third opening pattern including at least two openings on the first region and a fourth opening pattern including at least two openings on a second region surrounding the first region in the second film, the third opening pattern being provided in a position where the third opening pattern partly overlaps the first opening pattern and does not overlap the second opening pattern in plan view, and the fourth opening pattern being provided in a position where the fourth opening pattern does not overlap the first opening pattern, the second opening pattern, and the third opening pattern in plan view; and
   processing a portion of the substrate where the first opening pattern and the third opening pattern overlap each other in plan view,
   wherein the second opening pattern is designed to reduce variation in a coverage between the first opening pattern and the second opening pattern, and
   the fourth opening pattern is designed to reduce variation in a coverage between the third opening pattern and the fourth opening pattern.

8. The template manufacturing method according to claim 7, wherein
   the first film includes a first resist layer and a first sacrificial layer formed on the substrate, and
   the second film includes a second resist layer formed on the substrate.

9. The template manufacturing method according to claim 8, wherein
   the first film further includes a second sacrificial layer including a composition different from that of the first sacrificial layer.

10. The template manufacturing method according to claim 8, wherein
    the first sacrificial layer contains chromium, chromium oxide, or chromium nitride.

11. The template manufacturing method according to claim 9, wherein the second sacrificial layer contains silicon or silicon oxide.

12. A photomask manufacturing method comprising:

forming a light shield film on a substrate;

forming a first film on the light shield film;

forming a first opening pattern including at least two openings on a first region and a second opening pattern including at least two openings on a second region surrounding the first region in the first film, the second opening pattern being provided in a position where the second opening pattern does not overlap the first opening pattern in plan view;

forming a second film on the substrate on which the first film and the light shield film are formed, after forming the first opening pattern and the second opening pattern;

forming a third opening pattern including at least two openings on the first region and a fourth opening pattern including at least two openings on a second region surrounding the first region in the second film, the third opening pattern being provided in a position where the third opening pattern partly overlaps the first opening pattern and does not overlap the second opening pattern in plan view, and the fourth opening pattern being provided in a position where the fourth opening pattern does not overlap the first opening pattern, the second opening pattern, and the third opening pattern in plan view; and processing a portion of the light shield film, the portion corresponding to a position where the first opening pattern and the third opening pattern overlap each other in plan view, wherein the second opening pattern is designed to reduce variation in a coverage between the first opening pattern and the second opening pattern, and the fourth opening pattern is designed to reduce variation in a coverage between the third opening pattern and the fourth opening pattern.

13. The photomask manufacturing method according to claim 12, wherein the first film includes a first resist layer and a first sacrificial layer formed on the substrate, and the second film includes a second resist layer formed on the substrate.

14. The photomask manufacturing method according to claim 13, wherein the first film further includes a second sacrificial layer including a composition different from that of the first sacrificial layer.

15. The photomask manufacturing method according to claim 13, wherein the first sacrificial layer contains chromium, chromium oxide, or chromium nitride.

16. The photomask manufacturing method according to claim 14, wherein the second sacrificial layer contains silicon or silicon oxide.

17. The pattern forming method according to claim 1, wherein a coverage of the first opening pattern is 50%.

18. The pattern forming method according to claim 1, wherein coverages of the first and second opening patterns are 50%.

19. The template manufacturing method according to claim 7, wherein a coverage of the first opening pattern is 50%.

20. The template manufacturing method according to claim 7, wherein coverages of the first and second opening patterns are 50%.

* * * * *